(12) United States Patent
Celinska et al.

(10) Patent No.: US 7,639,523 B2
(45) Date of Patent: Dec. 29, 2009

(54) STABILIZED RESISTIVE SWITCHING MEMORY

(75) Inventors: Jolanta Celinska, Colorado Springs, CO (US); Matthew D. Brubaker, Colorado Springs, CO (US); Carlos A. Paz de Araujo, Colorado Springs, CO (US)

(73) Assignee: Symetrix Corporation, Colorado Springs, CO (US)

( * ) Notice: Subject to any disclaimer, the term of this patent is extended or adjusted under 35 U.S.C. 154(b) by 0 days.

(21) Appl. No.: 11/937,480

(22) Filed: Nov. 8, 2007

(65) Prior Publication Data

US 2008/0106927 A1  May 8, 2008

Related U.S. Application Data

(60) Provisional application No. 60/858,218, filed on Nov. 8, 2006, provisional application No. 60/904,768, filed on Mar. 2, 2007, provisional application No. 60/906,158, filed on Mar. 9, 2007, provisional application No. 60/913,245, filed on Apr. 20, 2007.

(51) Int. Cl.
*G11C 11/00* (2006.01)

(52) U.S. Cl. ........................ 365/148; 365/163

(58) Field of Classification Search ................. 365/159
See application file for complete search history.

(56) References Cited

U.S. PATENT DOCUMENTS

| | | | |
|---|---|---|---|
| 6,456,525 B1 * | 9/2002 | Perner et al. ................ | 365/171 |
| 6,841,833 B2 | 1/2005 | Hsu et al. | |
| 6,903,361 B2 | 6/2005 | Gilton | |
| 7,038,935 B2 | 5/2006 | Rinerson et al. | |
| 7,292,469 B2 * | 11/2007 | Lee et al. .................... | 365/163 |
| 7,394,680 B2 * | 7/2008 | Toda et al. .................. | 365/148 |
| 7,483,292 B2 * | 1/2009 | Lung .......................... | 365/158 |
| 7,515,461 B2 * | 4/2009 | Happ et al. ................. | 365/163 |
| 2007/0114509 A1 | 5/2007 | Herner | |
| 2008/0106925 A1 * | 5/2008 | Paz de Araujo et al. ..... | 365/148 |
| 2008/0106926 A1 * | 5/2008 | Brubaker et al. ............ | 365/148 |

OTHER PUBLICATIONS

Choi et al.; "Resistive Switching Mechanisms of $TiO_2$ Thin Films Grown By Atomic-Layer Deposition"; *Journal of Applied Physics* 98, 033715 (2005).
Inone et al.; "Nonpolar Resistance Switching Of Metal/Binary-Transition-Metal Oxides/Metal Sandwiches: Homogeneous/Inhomogeneous Transition Of Current Distribution"; *arXiv:Cond-mat*/0702564 v.1; Feb. 26, 2007.
Lai, Stephen; "Current Status of the Phase Change Memory and Its Future"; Intel Corporation, Research note RN2-05 (2005).
Mizutani, Uichiro; *Introduction to the Electron Theory of Metals*; Cambridge University Press; Cambridge, UK; 2001; pp. 444-447.
Nakajima et al.; "Surface Metallic Nature Caused By An In-Gap State Of Reduced NiO: A Photoemission Study"; *Journal of Electron Spectroscopy and Related Phenomena*; 144 147 (2005); pp. 873-875.
Orgal, Leslie E.; An Introduction to Transition-Metal Chemistry: Ligand-Field Theory; Methuen & Co. Ltd.; London; 1960.
Park et al.; "Influence Of Oxygen Content On Electrical Properties of NiO Films Grown By RF Reactive Sputtering"; *J. Vac. Sci. Technol.* B24(5); Sep./Oct. 2006.
Park et al.; "Reproducible Resistive Switching In Nonstoichiometric Nickel Oxide Films Grown by RF Reactive Sputtering For Resistive Random Access Memory Applications"; *J. Vac. Sci. Technol.* A 23(5); Sep./Oct. 2005.
*Wikepedia*; "Ligand Field Theory"; http://en.wikipedia.org/wik/Ligand_field theory.

* cited by examiner

*Primary Examiner*—Tan T. Nguyen
(74) *Attorney, Agent, or Firm*—Patton Boggs LLP

(57) ABSTRACT

A non-volatile resistive switching memory that includes a material which changes between the insulative and conductive states. The material is stabilized against charge trapping by oxygen vacancies by an extrinsic ligand, such as carbon.

12 Claims, 10 Drawing Sheets

(a) $\Delta_t$ is large (b) $\Delta_t$ is small

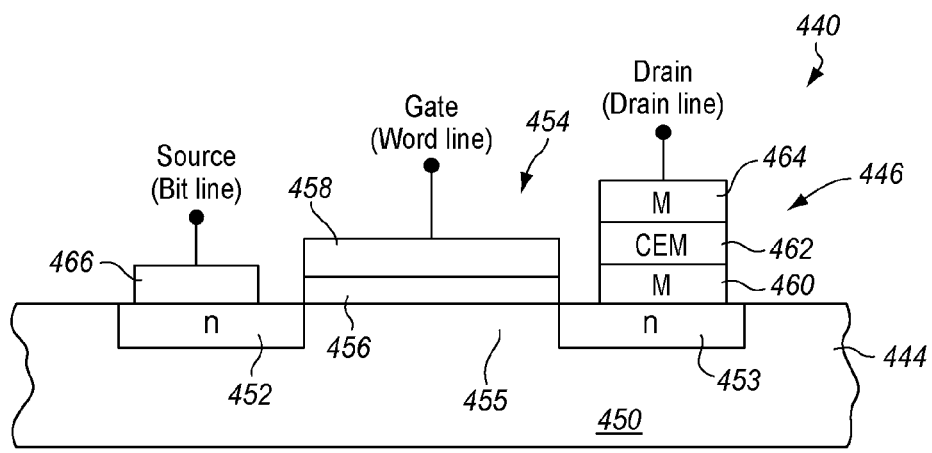
FIG. 18
FIG. 19
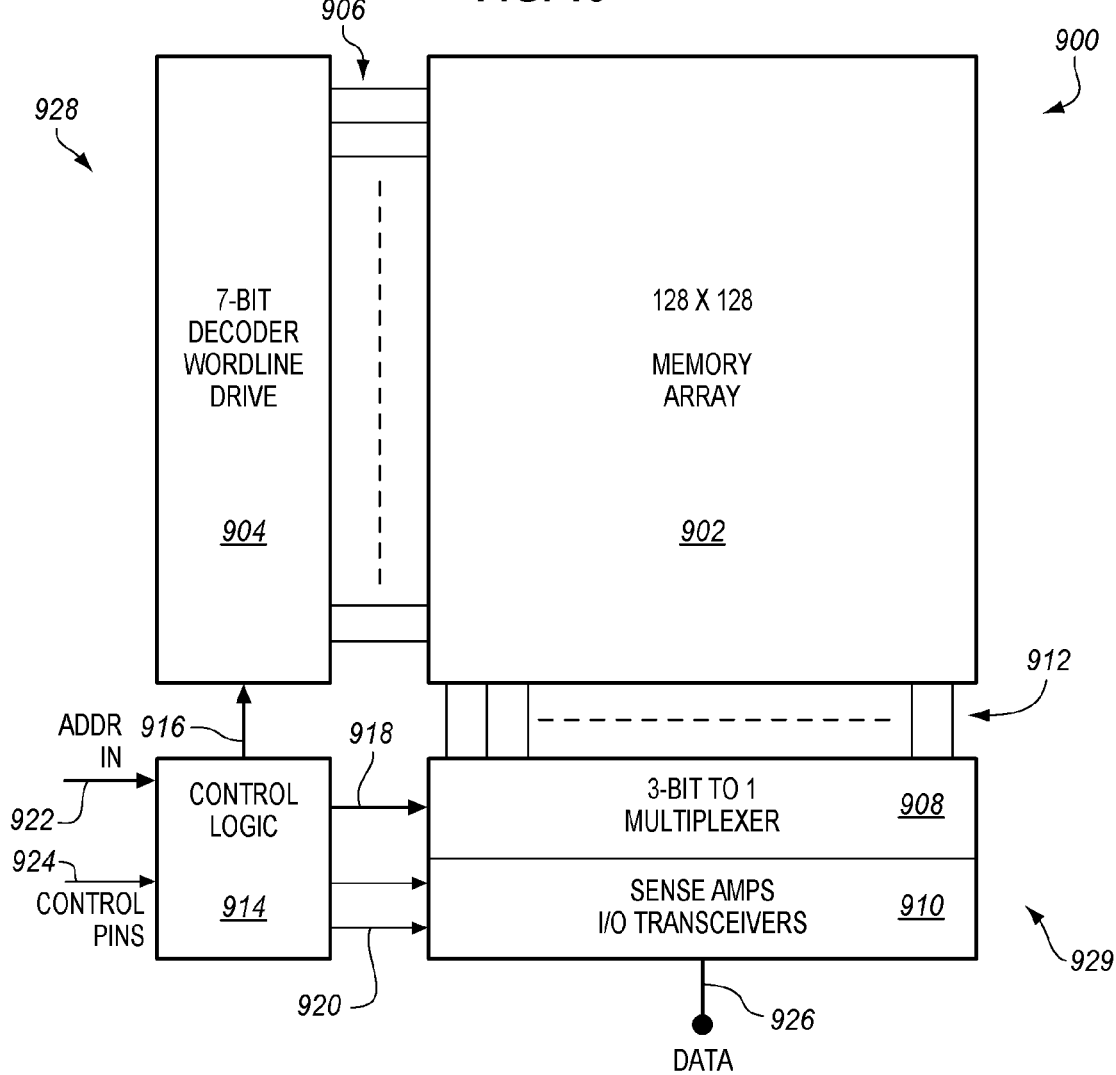

STABILIZED RESISTIVE SWITCHING MEMORY

CROSS-REFERENCE TO RELATED APPLICATIONS

This application is a Non-Provisional Application claiming the benefit of: Provisional (35 USC 119(e)) Application No. 60/858,218 filed on Nov. 8, 2006; Provisional (35 USC 119(e)) Application No. 60/904,768 filed on Mar. 2, 2007; Provisional (35 USC 119(e)) Application No. 60/906,158 filed on Mar. 9, 2007; and Provisional (35 USC 119(e)) Application No. 60/913,245 filed on Apr. 20, 2007. All of the foregoing provisional applications are hereby incorporated by reference to the same extent as though fully disclosed herein.

FIELD OF THE INVENTION

The invention in general relates to integrated circuit memories, and in particular, to the formation of non-volatile integrated circuit memories containing materials which exhibit a change in resistance.

BACKGROUND OF THE INVENTION

Non-volatile memories are a class of integrated circuits in which the memory cell or element does not lose its state after the power supplied to the device is turned off. The earliest computer memories, made with rings of ferrite that could be magnetized in two directions, were non-volatile. As semiconductor technology evolved into higher levels of miniaturization, the ferrite devices were abandoned for the more commonly known volatile memories such as DRAMs (Dynamic Random Access Memories) and SRAMs (Static-RAMs).

The need for non-volatile memories never went away. Thus, in the last forty years, many devices were created to fulfill this need. In the late 70's, devices were made with a metallization layer which either connected or disconnected a cell. Thus, at the factory, one could set values in a non-volatile way. Once, these devices left the factory, they could not be re-written. They were called ROMs (Read Only Memories). In 1967, I<hang and SZE at Bell Laboratories proposed devices which were made using field effect transistors (FETs) which had within layers of materials in the gate, the ability to trap charge. In the late 70's and early 80's, devices which could be written by the user and erased by de-trapping the electrons via ultra-violet light (UV) were very successful. The UV both required the device to be removed from the circuit board and placed under a UV lamp for over 15 minutes. These non-volatile memories were called PROMs or programmable ROMs. The writing process involved forcing current from the substrate below to these trap sites. This process of making the electrons pass through layers of materials which have an opposing potential energy barrier is known as quantum tunneling, a phenomenon that only occurs because of the wave-particle duality of the electron. Many types of sandwiches of materials for the gate stack of these FETs were tried, and the technology received many names such as MNOS (Metal-Nitride-Oxide-Semiconductor), SNOS ([Poly] Silicon-Gate Plus MNOS), SONOS (Silicon-Oxide Plus MNOS), and PS/O/PS/S Polysilicon Control Gate—Silicon Dioxide—Polysilicon Floating Gate—and a thin tunneling oxide on top of the silicon substrate). This kind of erasable and, thus, read/write non-volatile device was known as EEPROMs for electrically-erasable-PROMs, an unfortunate misnomer since they are not just "read only". Typically, EEPROMS have large cell areas and require a large voltage (from 12 to 21 volts) on the gate in order to write/erase. Also, the erase or write time is of the order of tens of microseconds. However, the worse limiting factor is the limited number of erase/write cycles to no more than slightly over 600,000—or of the order of $10^5$-$10^6$. The semiconductor industry eliminated the need of a pass-gate switch transistor between EEPROMs and non-volatile transistors by sectorizing the memory array in such a way that "pages" (sub-arrays) could be erased at a time in memories called Flash memories. In Flash memories, the ability to keep random access (erase/write single bits) was sacrificed for speed and higher bit density.

The desire to have low power, high speed, high density, and indestructibility has kept researchers working in non-volatile memory for the last forty years. FeRAMs (Ferroelectric RAMs) provide low power, high write/read speed, and endurance for read/write cycles exceeding 10 billion times. Magnetic memories (MRAMs) provide high write/read speed and endurance, but with a high cost premium and higher power consumption. Neither of these technologies reaches the density of Flash; thus, Flash remains the non-volatile memory of choice. However, it is generally recognized that Flash will not scale easily below 65 nanometers; thus, new non-volatile memories that will scale to smaller sizes are actively being sought.

To this end, there has been much research over the last ten to twenty years on memories based on certain materials that exhibit a resistance change associated with a change of phase of the material. In one type of variable resistance memory called an RRAM, a change in resistance occurs when the memory element is melted briefly and then cooled to either a conductive crystalline state or a non-conductive amorphous state. Typical materials vary and include GeSbTe, where Sb and Te can be exchanged with other elements of the same properties on the Periodic Table. These materials are often referred to as chalcogenides. See, for example, Stephan Lai, "Current Status of the Phase Change Memory and Its Future", Intel Corporation, Research note RN2-05 (2005); U.S. Pat. No. 7,038,935 issued to Darrell Rinerson et al., May 2, 2006; U.S. Pat. No. 6,903,361 issued to Terry L. Gilton on Jun. 7, 2005; and U.S. Pat. No. 6,841,833 issued to Sheng Teng Hsu et al., Jan. 11, 2005. However, these resistance-based memories have not proved to be commercially successful because their transition from the conductive to the insulating state depends on a physical structure phenomenon, i.e., melting (at up to 600° C.) and returning to a solid state that may not be sufficiently controlled for a useful memory.

Another variable resistance memory category includes materials that require an initial high "forming" voltage and current to activate the variable resistance function. This is usually referred to as electroforming. These materials include $Pr_xCa_yMn_zO_\epsilon$, with x, y, z, and $\epsilon$ of varying stoichiometry; transition metal oxides, such as CuO, CoO, $VO_x$, NiO, $TiO_2$, $Ta_2O_3$; and some perovskites, such as Cr; $SrTiO_3$. See, for example, "Resistive Switching Mechanisms of $TiO_2$ Thin Films Grown By Atomic-Layer Deposition", B. J. Choi et al., *Journal of Applied Physics* 98, 033715 (2005); "Reproducible Resistive Switching In Nonstoichiometric Nickel Oxide Films Grown By RF Reactive Sputtering For Resistive Random Access Memory Applications", Jae-Wan Park, et al., *J. Vac. Sci. Technol. A* 23(5), September/October 2005; "Influence Of Oxygen Content On Electrical Properties Of NiO films grown By RF Reactive Sputtering", Jae-Wan Park, et al., *J. Vac. Sci. Technol. B* 24(5), September/October 2006; "Nonpolar Resistance Switching Of Metal/Binary-Transition-Metal Oxides/Metal Sandwiches: Homogeneous/inhomogeneous Transition of Current Distribution", I. H. Inone et al., arXiv:Cond-mat/0702564 v.1, 26 Feb. 2007; and United States Patent Application Publication No. 2007/0114509 A1, Memory Cell Comprising Nickel-Cobalt Oxide Switching Element, on an application of S. Brad Herner. These memories are referred to as ReRAMs, to distinguish them from the chalcogenide type memories. Further, none demonstrate conductive and insulative states that are stable over the necessary temperature range and which do not fatigue over many memory cycles. FIG. 1 is an Arrhenius curve of the log of $1/\text{Tau}$ ($\sec^{-1}$) versus $1/T(1/K)$ for prior art sputtered NiO, illustrating that the transition from the high resistance state to the low resistance state in this typical prior art resistive switching material is caused by detrapping of electrons from oxygen vacancies in the sputtered NiO. To generate this Arrhenius curve, the relaxation time for the material to return to the insulative state after SET, Tau, was measured for a number of temperatures in the working range of a proposed variable resistance memory (below 70° C.) for NiO films made by sputtering. As known in the art, the slope of the Arrhenius curve 960 is proportional to the activation energy for the mechanism that is causing the relaxation. The slope found from curve 960 yields an activation energy of approximately 0.47 eV. This is essentially the activation energy for detrapping of electrons from oxygen vacancies in NiO. See "Surface Metallic Nature Caused By An In-Gap State Of Reduced NiO: A Photoemission Study", N. Nakajima et al., *Journal of Electron Spectroscopy and Related Phenomena*, 144 147 (2005) pp. 873-875. Thus, the variable resistance phenomenon of the prior art NiO devices is dominated by the trapping and detrapping of electrons in oxygen vacancies. Since detrapping is strongly temperature dependent, such a resistive switching mechanism must also be highly temperature dependent; therefore, it cannot form the basis for a commercially useful memory. Similarly, all other prior art resistive switching materials exhibit such unstable qualities.

Moreover, based on the ReRAM art to date, the use of materials that require a forming process must be said to be speculative, since the high voltage-high current forming step simply is not compatible with dense chip architecture. In fact, the Herner patent application reference merely speculates that a combination of nickel and cobalt oxides will eliminate the required high amplitude pulses, without providing an actual example to demonstrate it.

In summary, there have been literally hundreds, if not thousands, of papers and patent applications written on resistive memories in the last ten years, most of which have been speculative, such as the Herner application cited above. However, a workable resistance switching memory has never been made, because no one knows how to make a thin film resistance switching material that is stable over time and temperature. Thus, there remains a need in the art for a non-volatile resistance switching memory material that exhibits characteristics making it suitable for low power, high speed, high density memories, and which, at the same time, is stable over both time and temperature.

BRIEF SUMMARY OF THE INVENTION

The invention provides a solution to the above and other problems by including extrinsic ligands in the resistive switching material. The extrinsic ligands stabilize the resistive switching material, particularly the insulating state. As known in the art, transition metal oxides include an intrinsic ligand, namely oxygen. An extrinsic ligand is an element or compound other than oxygen that participates in the coordination sphere of the transition metal ion. Preferably, the stabilization is via a direct metal-extrinsic ligand bond, though the bond of the extrinsic ligand may also be with an intrinsic ligand. Carbon is an example of an extrinsic ligand element, and ammonia is an example of an extrinsic ligand compound. Carbon is the preferred extrinsic ligand. The carbon can link in many different forms, such as carbonyls, carbonates, and single element morphology.

A feature of the invention is vacancy passivation, and oxygen vacancy passivation in particular. As known in the art, oxides, and transition metal oxides in particular, are densely populated with vacancies. The uncompensated vacancy "charge sphere", sometimes referred in the art as the coordination sphere, is the region about an ion or electron trap in which vacancies can affect the ion or electron. Vacancies within this vacancy charge sphere can thermally detrap, and the electron can hop in and out of the vacancy site. This destabilizes the high resistance state. This is the principal reason for the instability of prior art variable resistance materials. In the materials according to the invention, the effect of the oxygen vacancies is "canceled" or compensated, primarily by the novel ligand structure of the resistive switching materials according to the invention.

Another feature of the invention is that the resistive switching materials according to the invention are realized in the conductive state, and no electroforming voltage or current is necessary to change them into a variable resistance material. That is, the material is formed with a propensity for a metal to insulator transition, so no further preparation, such as electroforming, is needed.

The invention provides a resistive switching integrated circuit memory comprising: a resistive switching memory cell including a resistive switching material comprising a transition metal compound containing an extrinsic ligand; a write circuit for placing the resistive switching memory cell in a first resistive state or a second resistive state depending on information input into the memory, wherein the resistance of the resistance switching material is higher in the second resistance state than in the first resistance state; and a read circuit for sensing the state of the memory cell and providing an electrical signal corresponding to the sensed state of the memory cell. Preferably, the transition metal compound is a transition metal oxide. Preferably, the extrinsic ligand comprises carbon or a carbon compound. Preferably, the resistive switching material is capable of being read $10^8$ times with less than 30% fatigue. Most preferably, the resistive switching material is capable of being read $10^8$ times with less than 20% fatigue. Preferably, the resistive switching material has a memory window that changes less than 50% over a temperature range of from minus 50° C. to 75° C. More preferably, the resistive switching material has a memory window that changes less than 35% over a temperature range of from minus 50° C. to 75° C. Most preferably, the resistive switching material has a memory window that changes less than 25% over a temperature range of from minus 50° C. to 75° C. Preferably, the resistive switching material comprises a material selected from the group consisting of aluminum, cadmium, chromium, cobalt, copper, gold, iron, manganese, mercury, molybdenum, nickel, palladium, rhenium, ruthenium, silver, tin, titanium, vanadium, zinc, and combinations thereof. Preferably, the extrinsic ligand comprises ammonia. Preferably, the ligand comprises one or more elements selected from the group consisting of oxygen, hydrogen, fluorine, carbon, nitrogen, chlorine, bromine, sulphur, and iodine.

The invention also provides a method of making a non-volatile resistive switching integrated circuit memory, the method comprising: providing an integrated circuit substrate; forming a resistive switching material on the substrate, the resistive switching material comprising a transition metal oxide and an extrinsic ligand capable of passivating oxygen vacancies in the transition metal oxide in at least a coordination region about each atom of the transition metal; and completing the integrated circuit to include the resistive switching material in an active element in the integrated circuit. Preferably, the extrinsic ligand is selected from the group consisting of carbon, carbon compounds, and ammonia. Preferably, the resistive switching material comprises a material selected from the group consisting of aluminum, cadmium, chromium, cobalt, copper, gold, iron, manganese, mercury, molybdenum, nickel, palladium, rhenium, ruthenium, silver, tin, titanium, vanadium, zinc, and combinations thereof. Preferably, the ligand comprises one or more elements selected from the group consisting of oxygen, hydrogen, fluorine, carbon, nitrogen, chlorine, bromine, sulphur, and iodine.

In another aspect, the invention provides a method of making a non-volatile resistive switching integrated circuit memory, the method comprising: providing an integrated circuit substrate; forming a resistive switching material on the substrate, the resistive switching material comprising a transition metal compound capable of switching between a conducting state and an insulating state; stabilizing vacancies in said transition metal compound; and completing the integrated circuit to include the resistance switching material in an active element in the integrated circuit. Preferably, the transition metal is selected from the group consisting of aluminum, cadmium, chromium, cobalt, copper, gold, iron, manganese, mercury, molybdenum, nickel, palladium, rhenium, ruthenium, silver, tin, titanium, vanadium, zinc, and combinations thereof. Preferably, the stabilizing comprises using an extrinsic ligand selected from the group consisting of carbon and ammonia. Preferably, the ligand comprises one or more elements selected from the group consisting of oxygen, hydrogen, fluorine, carbon, nitrogen, chlorine, bromine, sulphur, and iodine.

In yet another aspect, the invention provides a precursor for making a resistive switching material capable of switching between a conducting state and an insulating state, the precursor comprising a transition metal and a ligand capable of stabilizing the insulating state so that the material has a memory window that changes less than 50% over a temperature range of from minus 50° C. to 75° C. Preferably, the transition metal is selected from the group consisting of aluminum, cadmium, chromium, cobalt, copper, gold, iron, manganese, mercury, molybdenum, nickel, palladium, rhenium, ruthenium, silver, tin, titanium, vanadium, zinc, and combinations thereof. Preferably, the ligand is selected from the group consisting of carbon, carbon compounds, and ammonia. Preferably, the ligand comprises one or more elements selected from the group consisting of oxygen, hydrogen, fluorine, carbon, nitrogen, chlorine, bromine, sulphur, and iodine.

In yet a further aspect, the invention provides a resistive switching integrated circuit memory comprising: a resistive switching memory cell including a resistive switching material comprising a transition metal and carbon; a write circuit for placing the resistive switching memory cell in a first resistive state or a second resistive state depending on information input into the memory, wherein the resistance of the resistance switching material is higher in the second resistance state than in the first resistance state; and a read circuit for sensing the state of the memory cell and providing an electrical signal corresponding to the sensed state of the memory cell. Preferably, the resistive switching material comprises a transition metal compound containing carbon.

The invention provides, for the first time, a resistive switching memory that is stable with respect to both temperature and time. Numerous other features, objects, and advantages of the invention will become apparent from the following description when read in conjunction with the accompanying drawings.

BRIEF DESCRIPTION OF THE DRAWINGS

FIG. 18 is a cross-sectional view of a 1 transistor/1 resistor CEM switching cell according to the invention; and FIG. 19 illustrates an exemplary memory utilizing any of the memory cells disclosed herein.

DETAILED DESCRIPTION OF THE INVENTION

Figure 1:
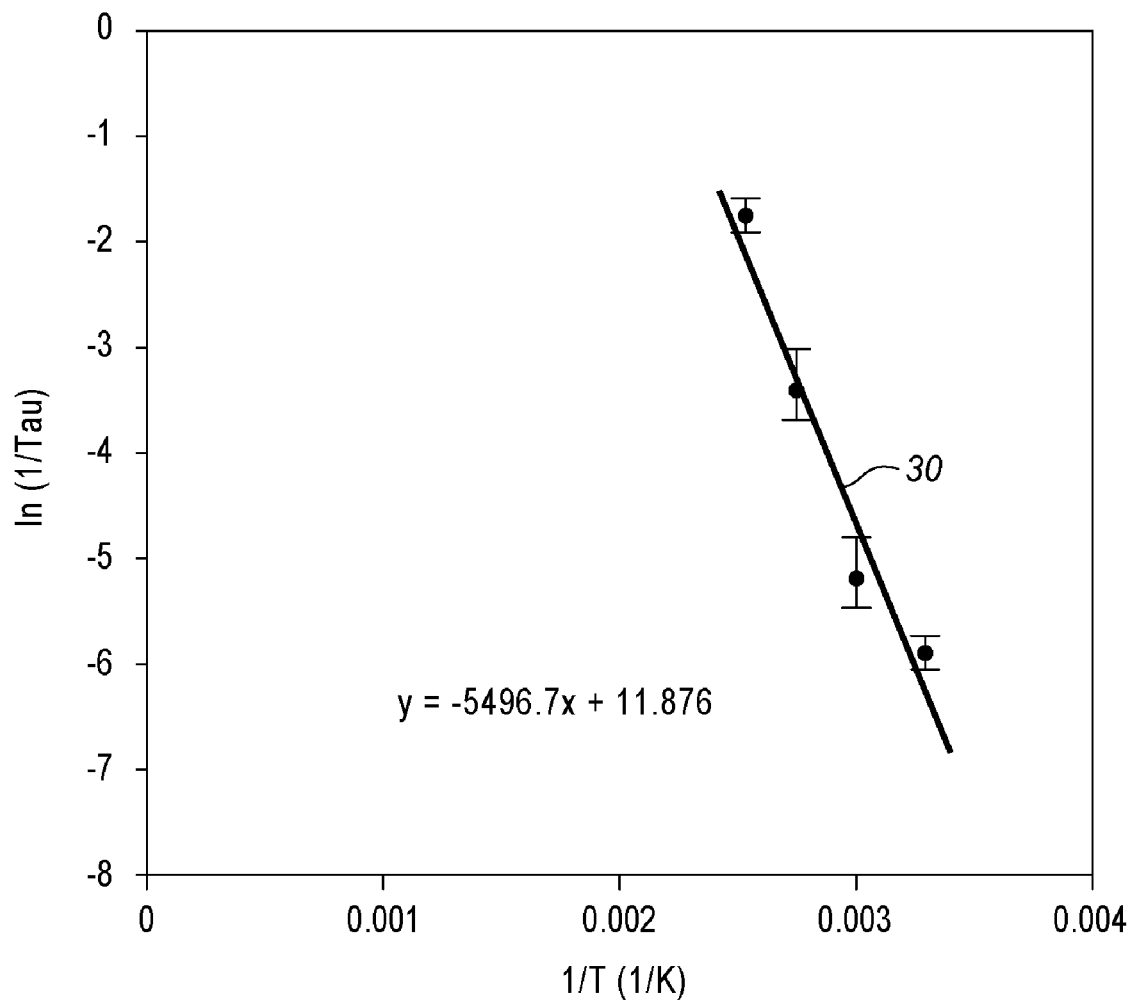
FIG. 1 is an Arrhenius curve of the log of 1/Tau ($sec^{-1}$) versus 1/T(1/K) for prior art sputtered NiO (without carbon) illustrating that the transition from the high resistance state to the low resistance state is caused by detrapping of electrons from oxygen vacancies in the sputtered NiO.
Figure 2:
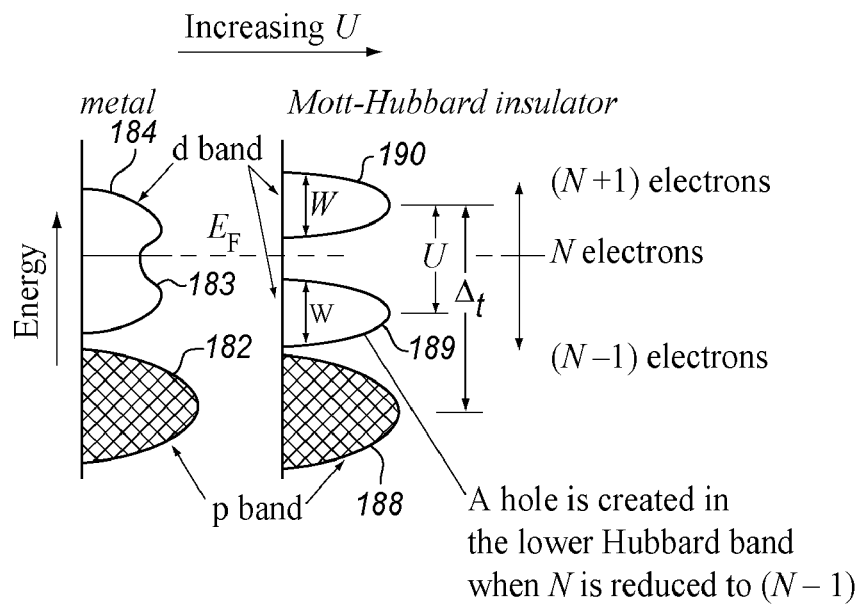
FIG. 2 is an illustration of the energy bands of a Mott-Hubbard insulator taken from *Introduction to the Electron Theory of Metals* by Uichiro Mizutani.
Figure 3:
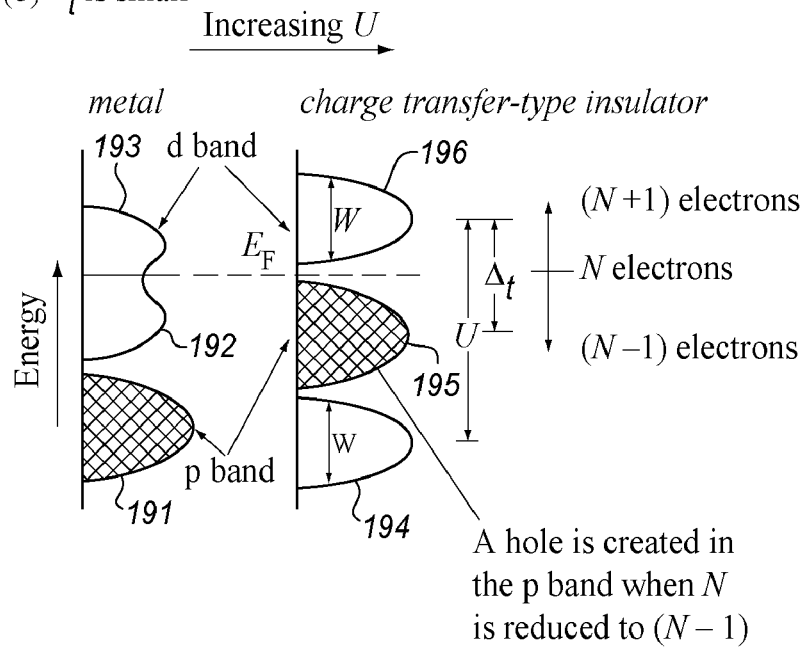
FIG. 3 is an illustration of the energy bands of a charge transfer type insulator taken from *Introduction to the Electron Theory of Metals* by Uichiro Mizutani.

The present disclosure focuses on transition metal oxide materials, particularly those which exhibit a metal/insulator transition of any type, which we shall refer to herein as variable resistance materials. The transition metal oxides are formed from elements that have a partially filled $3d$ band and materials with partially filled $3f$ bands in the periodic table. The most well known of these oxides are vanadium oxide and nickel oxide. The materials with partially filled $3d$ bands or partially filled $3f$ bands are sometimes described also as metal/insulator phase transition materials. However, such metallic to insulator transition can also occur in combining transition metals with other materials of systems such as sulfides, iodines, tellurides, and others that do not involve oxygen. In all such materials, which include groups IIIB up to and including group IIB (from column three to twelve across the Periodic Table—for half filled $3d$ materials and the elements 57 to 71 and 89 to 103 for the half filled $3f$ band), clear description of the electronic bands is still lacking due to the strong coulombic correlation between electrons. However, it is well known that narrow $3d$ and narrow $3f$ orbitals cause strong electron correlations, and such correlations are responsible for a switching mechanism that can be voltage or current activated.

An important breakthrough feature of the invention is the discovery of the stabilizing effect on the electronic properties when extrinsic ligand-forming dopants are added to the transition metal compounds. These extrinsic ligands stabilize the metals in the compounds to a stable valence state, also known as an oxidation number or coordination number, and neutralize the oxygen vacancies in the transition metal oxides, which we shall refer to herein as coordination passivation. With such stabilization, electroforming is no longer necessary. Herein, when the term "stabilized" is used with respect to the properties of a material, it means with respect to both time and temperature. In particular, it means that the electrical properties critical to reliable memory operation, including the RESET voltage, the SET voltage, and the memory window, e.g., the voltage difference between the non-conducting and conducting states, does not change more than thirty percent over operational time period and temperature range, i.e., over a time period of three years, and more preferably, five years, and most preferably, ten years, and a temperature range from 0° C. to 60° C., more preferably from −20° C. to 80° C., and most preferably from −50° C. to 125° C. More preferably, these electronic parameters do not change more then twenty-five percent, and most preferably, they do not change more than twenty percent. This stabilization of properties is based in a stable stoichiometry. For example, in the example of NiO, the metal bonds locally with oxygen, with $MO_6$ coordination, where M is the metal and O is oxygen. Thus, the coordination number is six. When oxygen is lost, the coordination number is less than six and oxygen vacancies appear, deforming the coordination sphere and the local coulombic field needed for proper electronic phase transitions.

As mentioned above, a feature of the invention is vacancy passivation, and oxygen vacancy passivation in particular. For example, in terms of the NiO example, in a region where the coordination sphere is defective with many oxygen vacancies, designated by $V_{OX}^{+2}$, where +2 is the net charge, each vacancy can trap up to two electrons. Such trapping is disruptive of an electronic phase change transition, as the electron can easily detrap with temperature and/or time. A carbon complex, such as $(CO)^{-2}$, when linked with Ni, can neutralize or compensate this vacancy to provide a local neutral charge. As known in the art, oxides, and transition metal oxides in particular, are densely populated with vacancies. The vacancy coordination sphere is the region about an ion or electron in which vacancies can affect the ion or electron. As shown in the discussion of FIG. 1, vacancies within this vacancy coordination sphere can thermally detrap, and the electron can move to the vacancy site. This gives rise to a variable resistance effect, but one that has an unstable high resistance state. This is the principle reason for the instability of prior art variable resistance materials. In the materials according to the invention, the effect of the oxygen vacancies is canceled, primarily by the novel ligand structure of materials according to the invention.

A related feature of the invention is the presence of extrinsic ligands that stabilize the variable resistance material of the invention. As known in the art, transition metal oxides include an intrinsic ligand, namely oxygen. An extrinsic ligand is an element or compound other than oxygen that participates in the coordination sphere of the transition metal ion. Preferably, the stabilization is via a direct metal-extrinsic ligand bond, though the bond of the extrinsic ligand may also be with an intrinsic ligand. Carbon is an example of an extrinsic ligand element, and carbon compounds and ammonia are examples of an extrinsic ligand compound. Carbon and carbon compounds are the preferred extrinsic ligands.

The physics and chemistry of ligands is well-developed. However, it has never before been applied to the improvement of a resistance switching mechanism in transition metal compounds. Ligand field theory was developed in the 1930's and 1940's as an extension of crystal field theory. See, for example, "Ligand Field Theory" in *Wikepedia,* the free encyclopedia at http://en.wikipedia.org/wik/Ligand_field theory, which is incorporated by reference herein to the same extent as though fully disclosed herein. As explained therein, the energy difference between certain molecular orbitals (MO's) is called $\Delta_0$, where the subscript "O" stands for octahedral coordination. The size of this energy difference, $\Delta_0$, determines the electronic structure of d orbitals. We have found that, in the thin-film regime used in the fabrication of the devices according to the invention, the stability of the memory window between the OFF state and the ON state is substantially proportional to the stability of $\Delta_0$. Thus, the preferred dopant ligands are those which result in a large and stable $\Delta_0$. Some useful dopant ligands in descending order of the size of the $\Delta_0$ they create are: CO, CN, $PPh_3$, $NO_2$, phen (1,10-phenanthroline, biby (2,2'-bipyridine), en (enthylenediamine), $NH_3$, (pyridine), $CH_3CN$, $NCS^-$, $H_2O$, $C_2O_4^{2-}$, $OH^-$, $F^-$, $N_3^-$, $NO_3^-$, $Cl^-$, $SCN^-$, $S^{2-}$, $Br^-$, and $I^-$. Theoretically, the crystal field splitting energy ($\Delta_0$) is not directly related to the Mott-charge transfer barrier or the Rice-Brickman mass; but the stability of the metal-native ligand coordination sphere allows the electron-electron correlations inductive of these transitions to occur in a particular material as the nuances of the bonding and crystal structures are set in place. In any case, the technical relevant effect is to control or stabilize the oxidation number (or coordination sphere) in such a way the local stoichiometry is "nominal" or otherwise suitable to induce the necessary electron correlation conditions.

"Extrinsic ligand" or "dopant ligand" is defined herein to be the ligand material added to transition metal complexes to stabilize the multiple valence states of the transition metals. By way of example, by compensating the oxygen vacancies, the transition metal does not have to compensate by emitting one or more electrons, and consequently changing its oxidation number. This allows the electrons to participate in an electronic phase transition. We use the term "extrinsic" or "dopant" because the ligand complex is an extrinsic material added to the lattice that is not intrinsic to the lattice structure of the transition metal compound itself. For example, in NiO, the oxygen is an intrinsic ligand, and $(CO)_4$, in forming $Ni(CO)_4$, is the extrinsic ligand. Similarly, other variants, such as $Ni_5(CO)_{12}$ (nickel carbonate), include a form of CO as extrinsic ligands to the basic NiO lattice. This is analogous to the use of the term dopant in semiconductor technology. That is, in semiconductor technology, adding a dopant to silicon, for example, does not change the silicon so much that we refer to it as another compound. Likewise, the dopant ligand added to say, nickel oxide, does not change the fact that the material is nickel oxide. However, local correction of the many possible oxidation numbers (valences) of Ni, such as Ni vacancies, interstitials, and oxygen vacancies that modify the nominal "+2" valence value, is achieved with ligands that mediate with the intrinsic ligand yielding a stable net oxidation number and eliminate the defect induced change in charge state.

The band structure of correlated electron materials according to the invention is complex and depends not only on the d-orbitals of the transition metals but also on the p-orbitals of the neighboring oxygen atoms. This is explained in detail in *Introduction to the Electron Theory of Metals*, Uichiro Mizutani, Cambridge University Press, Cambridge, UK, 2001, particularly pages 444-447, which is incorporated herein by reference to the same extent as though fully disclosed herein. FIGS. 14.9(a) and 14.9(b) from page 446 of this book are reproduced herein at FIGS. 13 and 14. The $\Delta$ used in this section is different than the $\Delta$ discussed above, so we shall refer to it as $\Delta_t$, since it is the charge transfer energy, i.e., the energy to transfer an electron from oxygen to the metal. In these figures, U is the d-orbital coulomb energy, sometimes referred to as the correlation energy, and EF is the Fermi level of the transition metal.

In both the Mott-Hubbard insulator of FIG. 13 and the charge transfer-type insulator of FIG. 14, when the density of electrons is small, U is small, and the d-orbitals 183, 192 and 184, 193, representing the density of states, overlap forming a wide d band with few electrons, while the filled p-band density of states 182, 191 is split from and below the d-band. Thus, the d-orbital density of states behaves much like a metal, and the material is conducting. As the density of electrons becomes large, differences occur. When $\Delta_t$ is larger than U, as in FIG. 13, the d-orbitals split into a pair of separated bands 189 and 190, and the p-orbital 188 remains below the d-orbital bands, which is the Mott-Hubbard insulator case.

When $\Delta_t$ is smaller than U, the p-orbital of the intrinsic ligand splits the d-orbital. In such conditions, the insulator is a charge-transfer insulator, which leads to lower operating voltages, since the RESET voltage is proportional to $\Delta_t$ and the memory window is proportional to U. Thus, correlated electron systems in which $\Delta_t$<U are preferred systems. One way of understanding the resistive change of the CEM materials can be seen most easily using FIG. 14. As indicated above, when the density of electrons is small, the two d-orbital bands 192 and 193 overlap and a conductor results. As the density of electrons increases, it will reach a point where the coulomb repulsion is so high that the d-orbitals 194 and 195 split with the filled p-orbital valence band between them. One d-orbital 194 is essentially filled, while the other 196 is empty. It requires a large amount of energy for electrons to jump from the lower band 194 into the upper band 196. Even if a d-d transition could occur with the aid of a hole in the p-orbital band, this requires a higher voltage, which is useful in the insulator to metal transition but not in the metal to insulator transition. Thus, this material will be an insulator with high resistance when the lower voltage induces a metal to insulator transition purely caused by increasing the local density of electrons. However, when the electric field created by the applied voltage becomes large enough, some electrons will begin to jump to the upper band 196. This creates an overlap of the upper empty band and lower filled d-bands, the condition of a highly conductive state with small coulomb repulsion, and the system collapses back to the state shown at the left in FIG. 14. From FIG. 14, it is also clear that transitions can be made from the p-orbital to the d-orbital which create "holes", which can be filled by electrons from filled d-bands. The interaction of d-d orbital transitions is highly dependent on the existence of p-orbitals in these CEM compounds. The absence of an oxygen atom in the lattice induces a +2 charge, i.e., a doubly charged vacancy, which would be neutralized if the oxygen would return with its −2 valence. Since this does not happen once the defect is in place, the Ni or other transition metal no longer coordinates or bonds normally with the oxygen; thus, the emission of up to two electrons into this positive potential makes the Ni become +4, with the result that it is no longer useful for a Mott or charge transfer condition. It is at this point that mediation between the defect and an extrinsic ligand re-establishes the oxidation state of the nickel. Without the ligand, the unbalanced, unstable insulative state is either heavily saturated with coordination destroying oxygen vacancies or equally detrimental and related excess nickel anions in interstitial sites in the lattice. That is, if there is an oxygen vacancy, these p-orbitals will not exist and, instead, the electrons of the d-bands 194 and 196 will stretch their orbitals towards the vacancy.

The metal-ligand-anion (MLA) bond which stabilizes the correlated electron material in some embodiments can be formed in many ways. For example, it may be formed in an anneal or other reaction process. For example, the CEMs may be annealed in a gas that contains the ligand chemical element, the anion element, and preferably also includes both the ligand element and the anion element. Any gas incorporating any of the ligands above may be used. The gas may be formed through conventional precursor vaporization processes, such as heating and bubbling. As another example, the CEM may be reactive sputtered in a gas containing the ligand chemical element, the anion element, or both. Again, any of the ligands above may be used. As an example, for NiO, with a carbon ligand and an oxygen anion, CO and $CO_2$ are possible annealing gases. The anneal may be performed with one or more of these gases, or may be performed in a mixture of an inert gas, such as argon or nitrogen, with the gas containing either the ligand element, the anion element, or both.

For additional understanding of ligand field theory and the related ligand chemistry, see *An Introduction to Transition-Metal Chemistry: Ligand-Field Theory*, Leslie E. Orgal, Methuen & Co. Ltd., London, 1960, which is hereby incorporated by reference to the same extent as though fully disclosed herein.

Some ligands are less useful than others because they are not stabilizing under all circumstances. Preferably, the invention utilizes ligands that stabilize the orbital valence states, and particularly the 3d orbital states. For example, the complex $[Ti(H_2O)_6]^{3+}$ is not stabilizing for conventional CMOS processing because, when it is annealed, the water evaporates leaving uncompensated titanium, which can take many different valence states. Such a material will require electroforming.

Some useful ligands for various metals are shown in Table I. In this table, the metal of interest is given in bold, followed by the formula for the complex the metal forms with the ligand of interest.

TABLE I

Aluminum

$[Al(OH)_4]^-$
$[AlF_6]^{3-}$

Cadmium

$[Cd(CN)_4]^{2-}$
cis-$Cd(NH_3)_4Cl_2$
trans-$Cd(NH_3)_4Cl_2$

Chromium

$Cr(acac)_3$
$[Cr(CN)_6]^{4-}$
$[Cr(en)_3]^{3+}$
$[CrF_6]^{4-}$
$[Cr(NH_3)_6]^{3+}$
$[Cr(OH_2)_6]^{3+}$
$[CrO_4]^{2-}$
cis-$Cr(acac)_2(OH_2)_2$
trans-$Cr(acac)_2(OH_2)_2$
cis-$[Cr(NH_3)_4Cl_2]^+$
trans-$[Cr(NH_3)_4Cl_2]^+$
$[Cr(NH_3)_5Br]^{2+}$
$[Cr(NH_3)_5Cl]^{2+}$
$[Cr(NH_3)_5(OSO_3)]^+$
cis-$[Cr(OH_2)_4Cl_2]^+$
trans-$[Cr(OH_2)_4Cl_2]^+$
$[Cr(OH_2)_5Br]^{2+}$
$[Cr(OH_2)_5Cl]^{2+}$
$[Cr_2O_7]^{2-}$

Cobalt

$[CoBr_4]^{2-}$
$[CoBr_6]^{4-}$
$[CoCl_4]^{2-}$
$[Co(CN)_6]^{3-}$
$[Co(en)_3]^{3+}$
$[CoF_6]^{3-}$
$[Co(NH_3)_6]^{2+}$
$[Co(NH_3)_6]^{3+}$
$[Co(OH_2)_6]^{2+}$
$[Co(O_3C)_3]^{3-}$
Cis$[Co(en)_2Cl_2]^+$
trans-$[Co(en)_2Cl_2]^+$
cis-$[Co(OH_2)_4(SCN)_2]^+$
trans-$[Co(OH_2)_4(SCN)_2]^+$
cis-$[Co(NH_3)_4Cl_2]^+$
trans-$[Co(NH_3)_4Cl_2]^+$
cis-$Co(NH_3)_4(NO_2)_2$
trans-$Co(NH_3)_4(NO_2)_2$
cis-$Co(NH_3)_4(ONO)_2$
trans-$Co(NH_3)_4(ONO)_2$
cis-$[Co(ox)_2(OH_2)_2]^-$
trans-$[Co(ox)_2(OH_2)_2]^-$
cis-$[Co(en)_2(NO_2)Cl]^+$
trans-$[Co(en)_2(NO_2)Cl]^+$
$[Co(NH_3)_5Cl]^{2+}$
$[Co(NH_3)_5(NO_2)]^{2+}$
cis-$[Co(NH_3)Br(en)_2]^{2+}$
trans-$[Co(NH_3)Br(en)_2]^{2+}$

Copper

$[Cu(CN)_2]^-$
$[Cu(NH_3)_4]^{2+}$
$[Cu(OH_2)_6]^{2+}$
cis-$[Cu(en)_2(OH_2)_2]^{2+}$
trans-$[Cu(en)_2(OH_2)_2]^{2+}$

Gold

$[Au(CN)_2]^-$

Iron

$[Fe(Cl)_4]^-$
$[Fe(CN)_6]^{3-}$

TABLE I-continued $[Fe(CN)_6]^{4-}$
$Fe(CO)_5$
$[Fe(EDTA)]^{2-}$
$[Fe(en)_3]^{3+}$
$[Fe(OH_2)_6]^{2+}$
$[Fe(OH_2)_6]^{3+}$
$[Fe(ox)_3]^{3-}$
$[Fe(SCN)_6]^{3-}$
cis-$[Fe(en)_2(NO_2)_2]^+$
trans-$[Fe(en)_2(NO_2)_2]^+$
$[Fe(OH)(OH_2)_5]^{2+}$

Manganese

$[MnCl_6]^{4-}$
$[Mn(CN)_6]^{3-}$
$[Mn(CN)_6]^{4-}$
$[Mn(en)_3]^{2+}$
$[Mn(OH_2)_6]^{2+}$
$[MnO_4]^-$

Mercury

$[HgS_2]^{2-}$
$[HgCl_3]^-$
$[HgI_4]^{2-}$

Molybdenum

$[MoO_4]^{2-}$

Nickel

$[NiBr_4]^{2-}$
$[Ni(CN)_4]^{2-}$
$Ni(CO)_4$
$[Ni(en)_3]^{2+}$
$[Ni(NH_3)_4]^{2+}$
$[Ni(NH_3)_6]^{2+}$
$[Ni(OH_2)_6]^{2+}$
$[Ni(ox)_2]^{2-}$
$[Ni(penten)]^{2+}$
cis-$Ni(en)_2Cl_2$
trans-$Ni(en)_2Cl_2$

Palladium

$[PdCl_4]^{2-}$

Platinum

$[PtCl_4]^{2-}$
$[PtCl_6]^{2-}$
$[PtCl_6]^{4-}$
$[PtI_4]^{2-}$
$[PtI_6]^{2-}$
$[Pt(NH_3)_4]^{2+}$
$Pt(en)Cl_2$
cis-$Pt(NH_3)_2Cl_2$
trans-$Pt(NH_3)_2Cl_2$
cis-$Pt(NH_3)_2Cl_4$
trans-$Pt(NH_3)_2Cl_4$
$Pt(NH_3)_2(ox)$
$[Pt(NH_3)_3Br]^+$
trans-$[Pt(NH_3)_4Cl_2]^{2+}$
cis-$[Pt(NH_3)_4Cl_2]^{2+}$
cis-$[Pt(NH_3)_4I_2]^{2+}$
trans-$[Pt(NH_3)_4I_2]^{2+}$

Rhenium

$[ReO_4]^-$

Rhodium

$[RhCl_6]^{3-}$
$[RhI_2(CO)_2]^-$
cis-$[Rh(phen)_2Cl_2]^+$

Ruthenium

$[Ru(NH_3)_6]^{2+}$
$[Ru(phen)_3]^{2+}$
$[Ru(NH_3)_5Cl]^{2+}$

Silver

$[Ag(S_2O_3)_2]^{3-}$
$[Ag(NH_3)_2]^+$

TABLE I-continued

Tin $[SnCl_6]^{2-}$
$[Sn(OH)_6]^{2-}$
$[Sn(OH)_3]-$

Titanium $[TiO]^{2+}$

Vanadium $[V(en)_3]^{3+}$
$[VO]^{2+}$
$[VO_2]^+$
$[VOCl_4]^{2-}$

Zinc $[Zn(CN)_4]^{2-}$
$[Zn(NH_3)_4]^{2+}$

In the examples below, nickel oxide, NiO, is disclosed as the exemplary transition metal oxide, though it should be understood that this is exemplary only and is not intended to limit the invention. All the NiO materials discussed herein are doped with extrinsic ligands which stabilize the variable resistance properties. In general, this may be written as NiO $(L_x)$, where $L_x$ is a ligand element or compound and x indicates the number of units of the ligand for one unit of NiO. One skilled in the art can determine the value of x for any specific ligand and any specific combination of ligand with NiO or any other transition metal simply by balancing valences. When a specific ligand is referred to, this may be indicated by explicitly showing the ligand. For example, when the transition metal is nickel oxide and the ligand is carbon or a carbon compound, the material may be written as NiO($C_x$). One skilled in the art can determine the value of x for any specific carbon containing ligand and any specific combination of carbon containing ligand with NiO simply by balancing valences. However, at times the nickel oxide with carbon containing ligand may be written NiO, though it should be understood that a carbon extrinsic ligand is present unless specifically stated otherwise. The following provides an example of a carbon containing ligand resulting in stabilization of oxygen vacancies:

Since

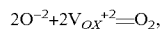
$2O^{-2}+2V_{OX}^{+2}=O_2,$ then

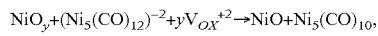
$NiO_y+(Ni_5(CO)_{12})^{-2}+yV_{OX}^{+2} \rightarrow NiO+Ni_5(CO)_{10},$ where y can be any number.

Figure 4:
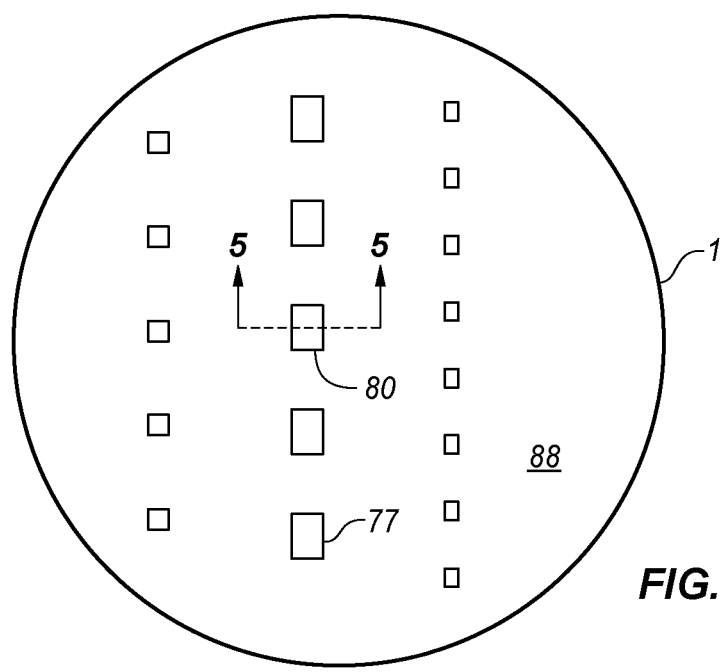
FIG. 4 illustrates a silicon wafer with CEM "elements" comprising a CEM material according to the invention sandwiched between two electrodes.
Figure 5:
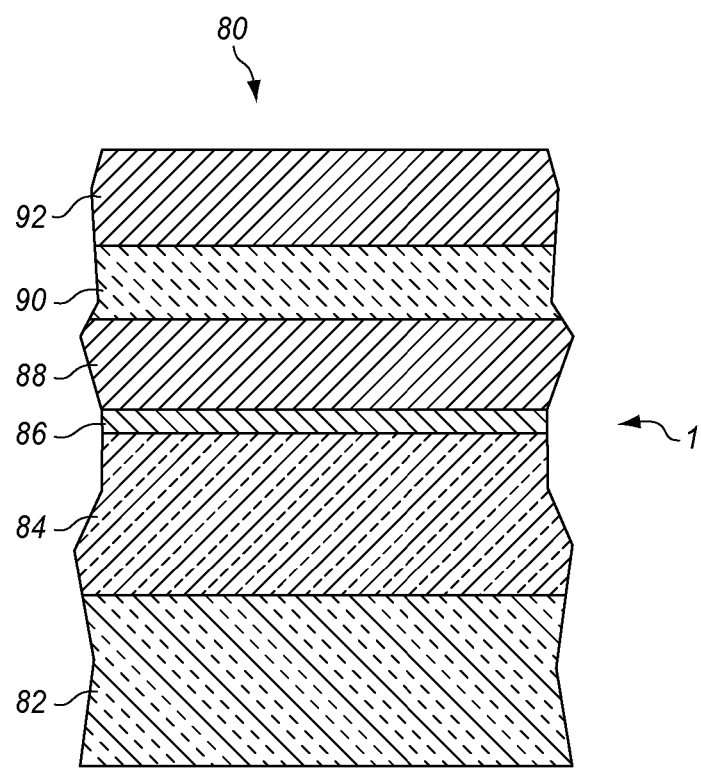
FIG. 5 shows a cross-sectional view of one of the "elements" of FIG. 3 taken through the line 4-4 of FIG. 4.

Turning now to FIGS. 4 and 5, resistive switching integrated circuit elements such as 77 and 80 are formed on a silicon wafer 1. FIG. 5 shows a cross-section through element 80 taken through line 5-5 of FIG. 4. Element 80 is formed on a silicon substrate 82 having a silicon dioxide coating 84. Optionally, a thin layer 86 of titanium or titanium oxide may be formed on oxide layer 84, though the elements reported on herein did not have such a layer. A layer 88, preferably of platinum, is formed on either layer 86 or directly on oxide layer 84. Layer 86 is an adhesion layer to assist the platinum in adhering to silicon dioxide layer 84. Resistive switching material 90 is formed on platinum bottom electrode 88, preferably by a liquid deposition process, such as spin coating, misted deposition, CVD, or atomic layer deposition. Top electrode 92, preferably platinum, then is formed on resistive switching layer 90. The elements 77, 80, etc. are then patterned by etching down to bottom electrode 88. The various elements 77, 88 can then be tested by attaching one probe to platinum surface 88 and touching a fine probe to the top electrode, such as 92, of the element to be tested, such as 80. The various curves discussed below were generated in this manner.

It should be understood that figures such as FIGS. 4, 5, and 18 depicting integrated circuit devices are not meant to be actual plan or cross-sectional views of any particular portion of actual integrated circuit devices. In actual devices, the layers will not be as regular, and the thicknesses may have different proportions. The various layers in actual devices often are curved and possess overlapping edges. Instead, the figures show idealized representations which are employed to explain more clearly and fully the method of the invention than would otherwise be possible. Also, the figures represent only one of innumerable variations of devices that could be fabricated using the designs and methods of the invention. As is conventional in the art, the term "metal" when referring to an electrode or other wiring layer generally means a conductor. As is known in the art, such "metal" electrodes and/or wiring layers can be made of polysilicon or other conductive material and are not necessarily made of metal.

Figure 6:
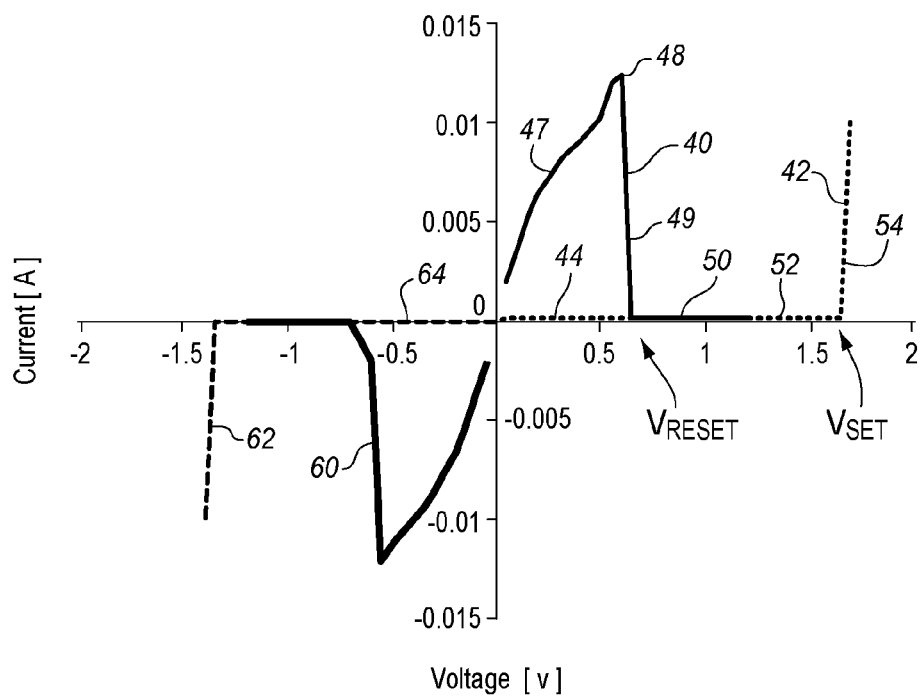
FIG. 6 shows the current in amperes versus bias voltage in volts curves for a NiO resistor according to the invention.
Figure 7:
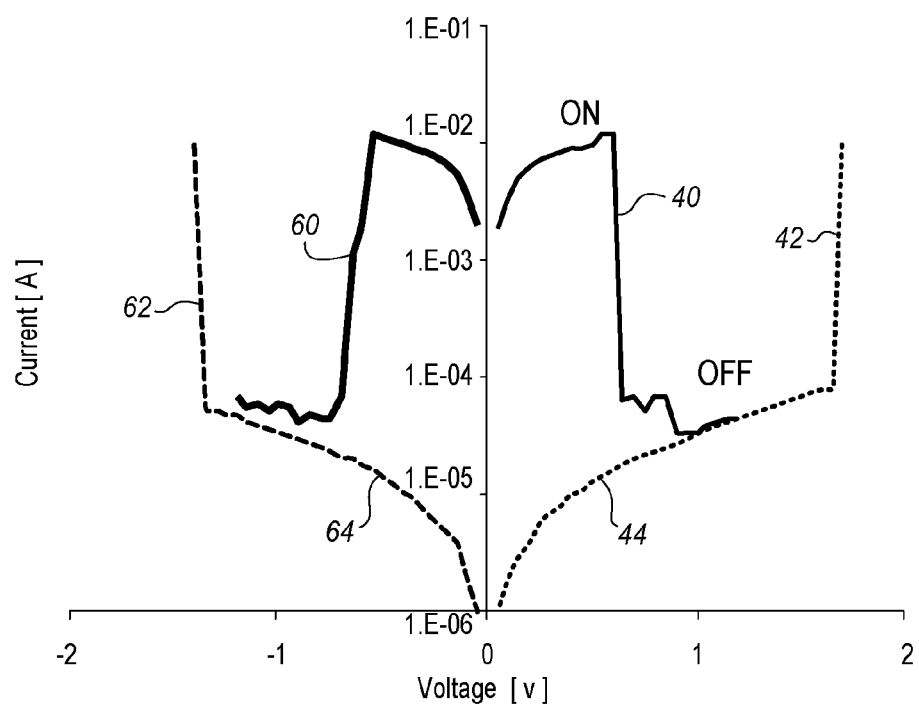
FIG. 7 shows the same curves as shown in FIG. 1 except on a logarithmic scale which shows higher resolution at the smaller values of current.

FIG. 6 shows the current in amperes (amps) versus bias voltage in volts curves for an NiO($L_x$) CEM according to the invention. FIG. 7 shows the same curves except the absolute value of the current is plotted logarithmically to show more detail in the low current values. As has become the nomenclature in the art, the point at which the material changes in resistance from a conductor to an insulator is called the RESET point, while the point at which the resistance changes from an insulator to a conductor is called the SET point. Unlike other variable resistance materials, the materials with oxygen vacancy suppressing ligands are conductive when formed. We shall refer to the conductive state as the ON state and the insulative state will be called the OFF state. The solid line 40 is the ON state curve for positive voltages, and the solid line 60 is the ON curve for negative voltages. The dotted line 54 is the OFF curve for positive voltages, while the dotted line 62 is the OFF curve for negative voltages. As the voltage is increased, the current rises at 47, until the RESET voltage is reached, which is about 0.65 volts, which is also the point at which critical electron density is reached; then, at point 48, the material suddenly becomes insulative and the current drops sharply along curve 49. The current stays low along the line 52 as the voltage rises until the SET voltage is reached at about 1.65 volts, which, in a temperature to voltage conversion, corresponds to the Neel temperature for these materials, at which point the material again becomes conductive and the current rises along line 54. If the voltage is returned to zero and then raised again when the material is in the insulative state, the current follows the line 44, while the voltage is returned to zero after the material becomes conducting; that is, after the $V_{SET}$ point, the current follows the line 47. It is evident from FIGS. 6 and 7 that the write memory window exists between $V_{reset}$ and $V_{set}$, while the read memory window exists between the ON and OFF state current level.

Figure 8:
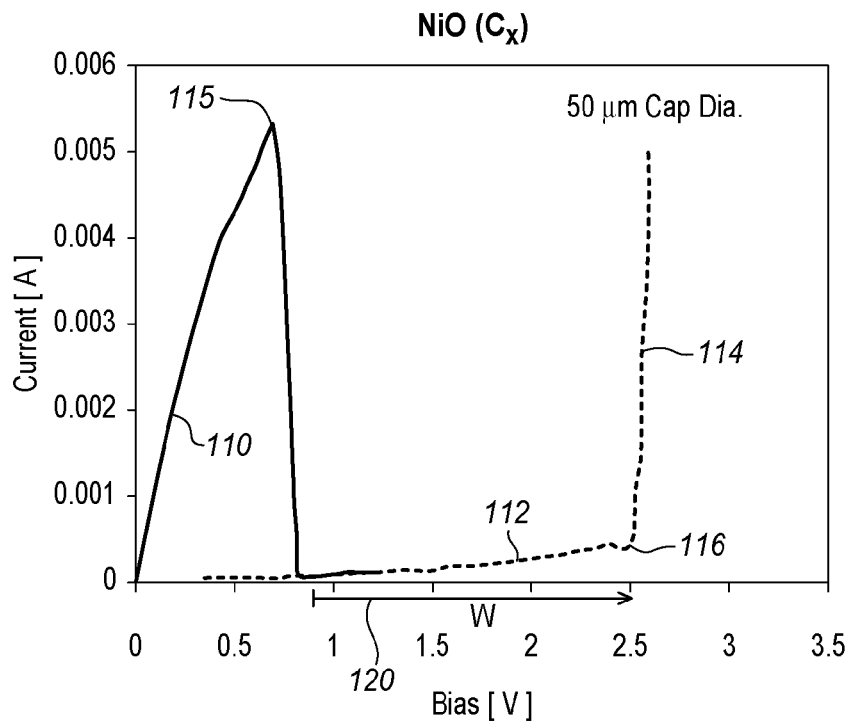
FIG. 8 is a graph of voltage versus current illustrating the SET and RESET functions for a NiO element having a diameter of 50 microns.
Figure 9:
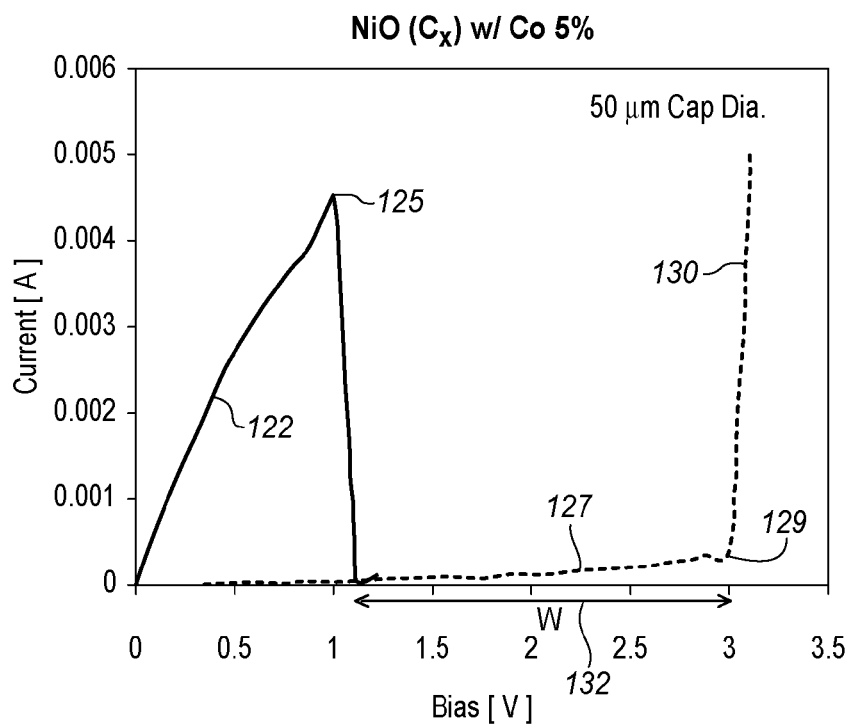
FIG. 9 is a graph of voltage versus current illustrating the SET and RESET functions for a NiO element with the CEM material doped with 5% cobalt and having a diameter of 50 microns.

FIG. 8 is a graph of voltage versus current illustrating the SET and RESET functions for a NiO($L_x$) resistor having a diameter of 50 microns, and FIG. 9 is a graph of voltage versus current illustrating the SET and RESET functions for a NiO capacitor doped with 5% cobalt, with the carbon-based extrinsic dopant, and having a diameter of 50 microns. FIG. 8 is similar to the curve of FIG. 6 discussed above and is presented to facilitate comparison with FIG. 9. The general shape of the ON curves 110 and 122 and 114 and 130 remain essentially the same, as do the shape of the OFF curves 112 and 127. When comparing the curves of FIGS. 8 and 9, it is observed that the RESET point 115 for the NiO(L$_x$) material is at about 0.8 volts, while the RESET point 125 of the material doped with cobalt is about 1.15 volts. Further, the SET point 116 for the NiO(L$_x$) is at about 2.5 volts, while the SET point 129 of the material doped with cobalt is about 3 volts. Further, the width W of window 120 is about 1.75 volts, while the width W of window 132 is about 1.85 volts. Thus, the onset of the insulative state has shifted, with the overall window W widening. These figures indicate that, with selective doping, the onset of the states and the width of the voltage window can be adjusted.

Figure 10:
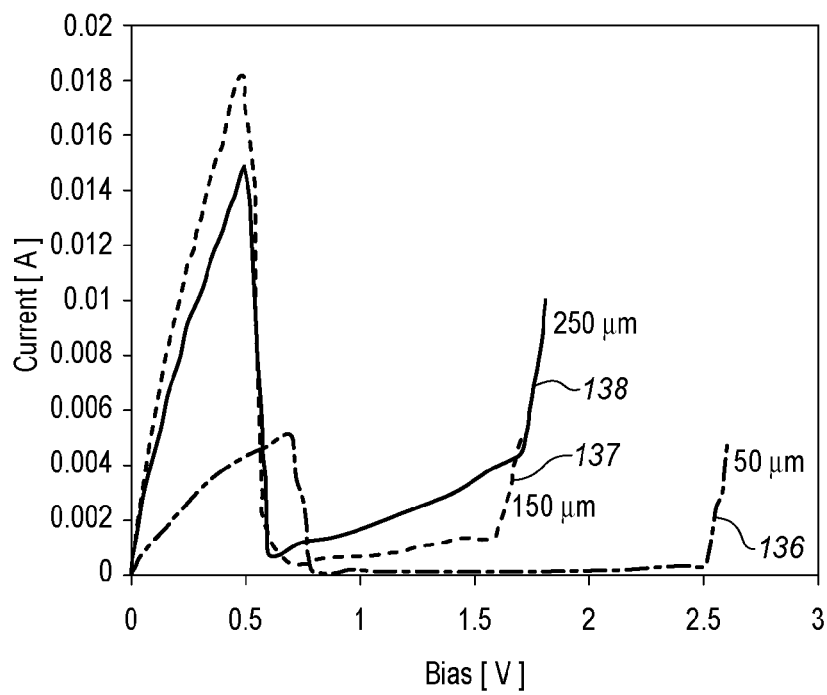
FIG. 10 show graphs of voltage versus current illustrating the SET and RESET functions for three NiO elements having different diameters illustrating how the memory window changes with element diameter.
Figure 11:
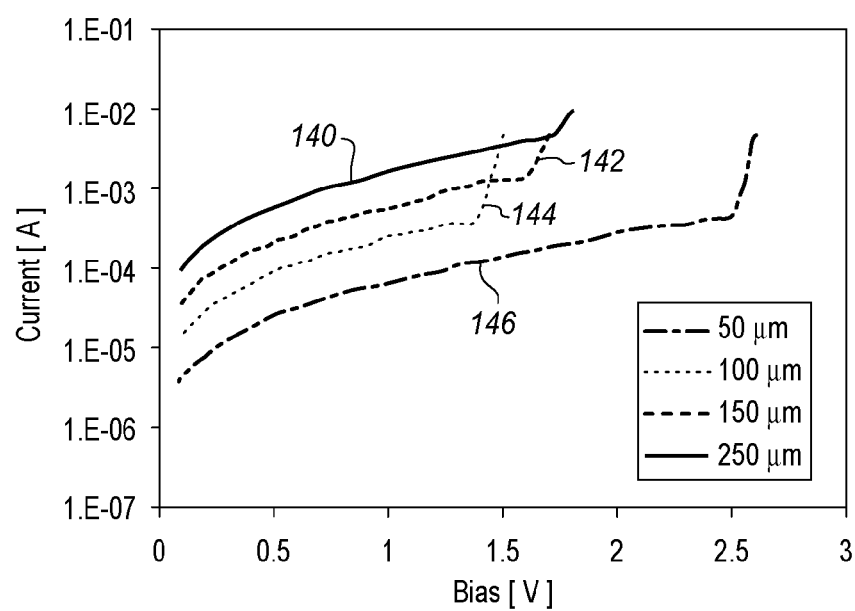
FIG. 11 show graphs of voltage versus current in the high resistance state for four NiO sandwiches having different diameters.
Figure 12:
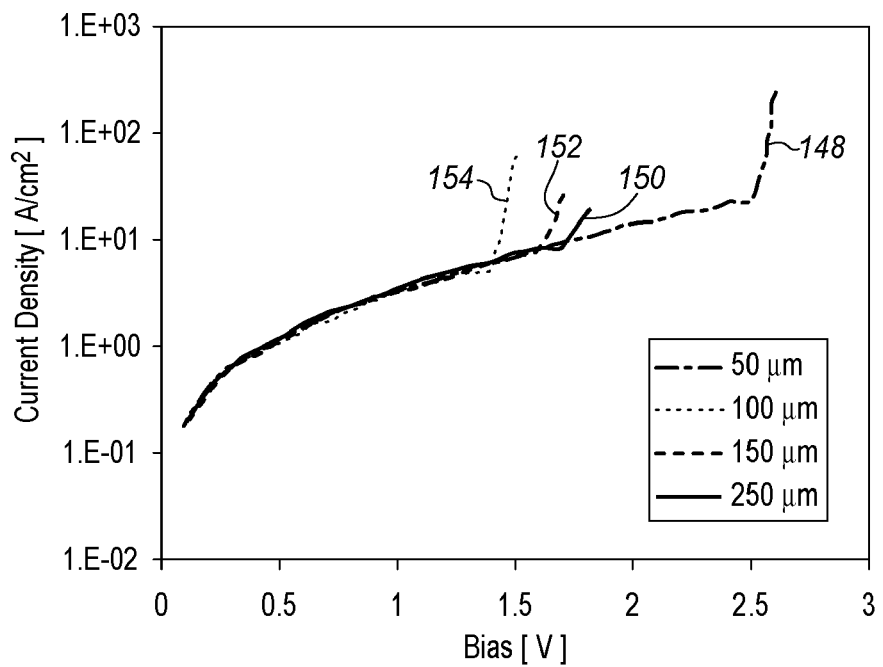
FIG. 12 show graphs of voltage versus current density in the high resistance state for the four elements of FIG. 8.

FIG. 10 show graphs 136, 137, and 138 of voltage versus current illustrating the SET and RESET functions for three NiO(C$_x$) sandwich elements having diameters of 50 microns, 150 microns, and 250 microns, respectively, illustrating how the memory window changes with element diameter. FIG. 11 show graphs 140, 142, 144, and 146 of voltage versus current in the high resistance state for four NiO sandwich elements having diameters of 250 microns, 150 microns, 100 microns, and 50 microns, respectively; and FIG. 12 show graphs 148, 150, 152, and 154 of voltage in volts versus current density, in amps per square centimeter, in the high resistance state for the four elements, respectively, of FIG. 11.

Figure 13:
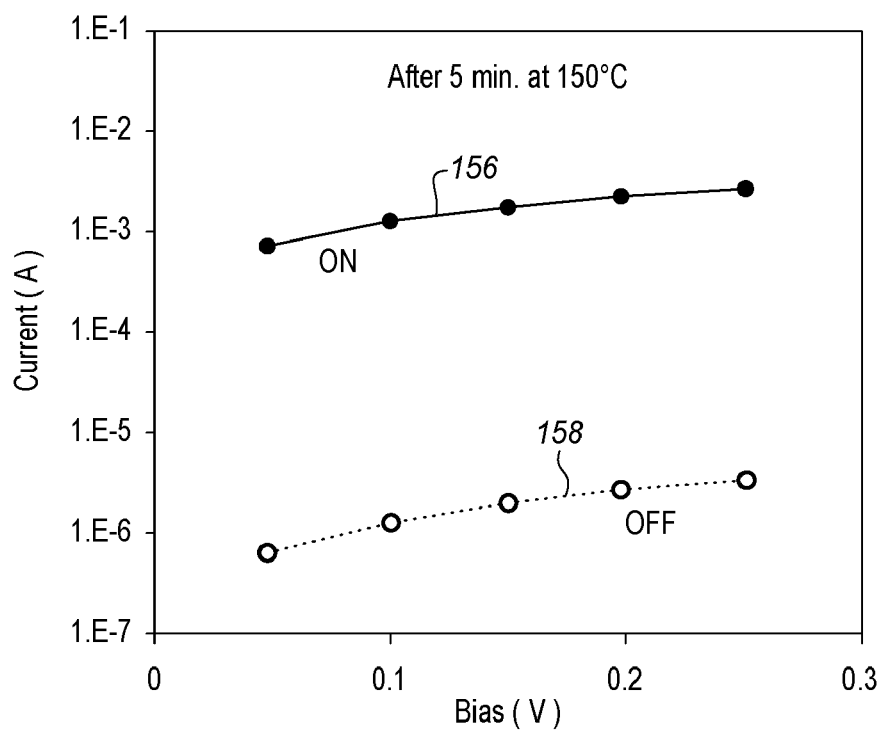
FIG. 13 shows a graph of current in amps versus bias voltage in volts for the ON and OFF states after the NiO CEM was held at 150° C. for five minutes.
Figure 14:
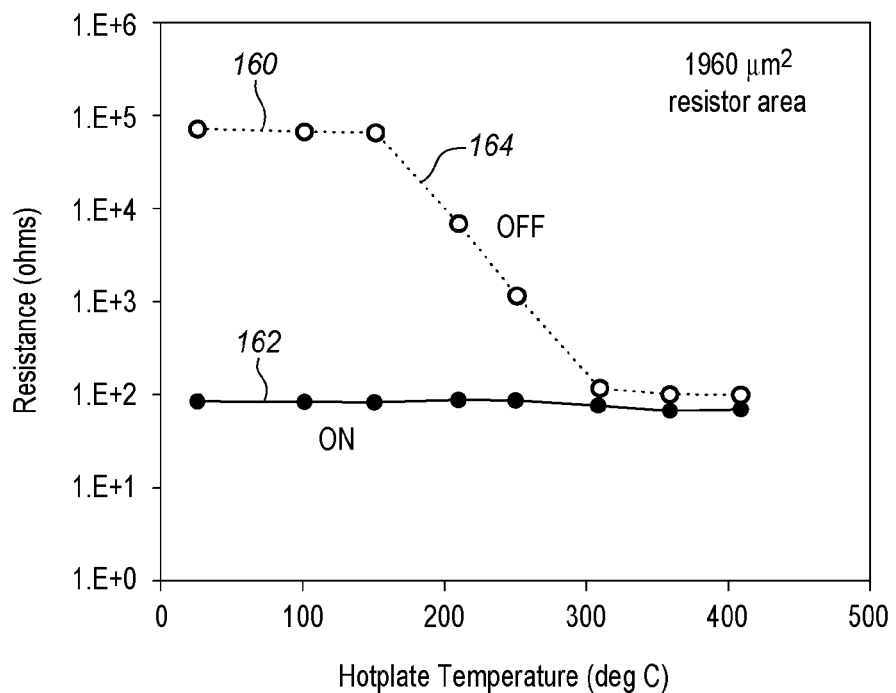
FIG. 14 shows a graph of resistance in Ohms versus temperature in degrees centigrade for the ON and OFF states illustrating the stability of these states at higher temperatures.

FIG. 13 shows a graph of current in amps versus bias voltage in volts after the resistive switching material was held at 150° C. for five minutes. This graph shows no degradation of the ON state 156 or OFF state 158 indicating the temperature stability of the resistance change phenomenon according to the invention. FIG. 14 shows a graph of resistance in Ohms versus hot plate temperature in degrees centigrade. To generate this curve, the resistive switching integrated circuit elements were placed on a hot plate and heated to the temperature shown. This graph shows that the OFF state 160 degrades above 150° C., as shown by the declining curve 164, but the ON state 162 did not degrade. Above 410° C., switching ability was not regained for the OFF state and was regained only with difficulty for the ON state. This graph demonstrates that memories made with the CEM material according to the invention should be stable at all reasonable temperatures.

Figure 15:
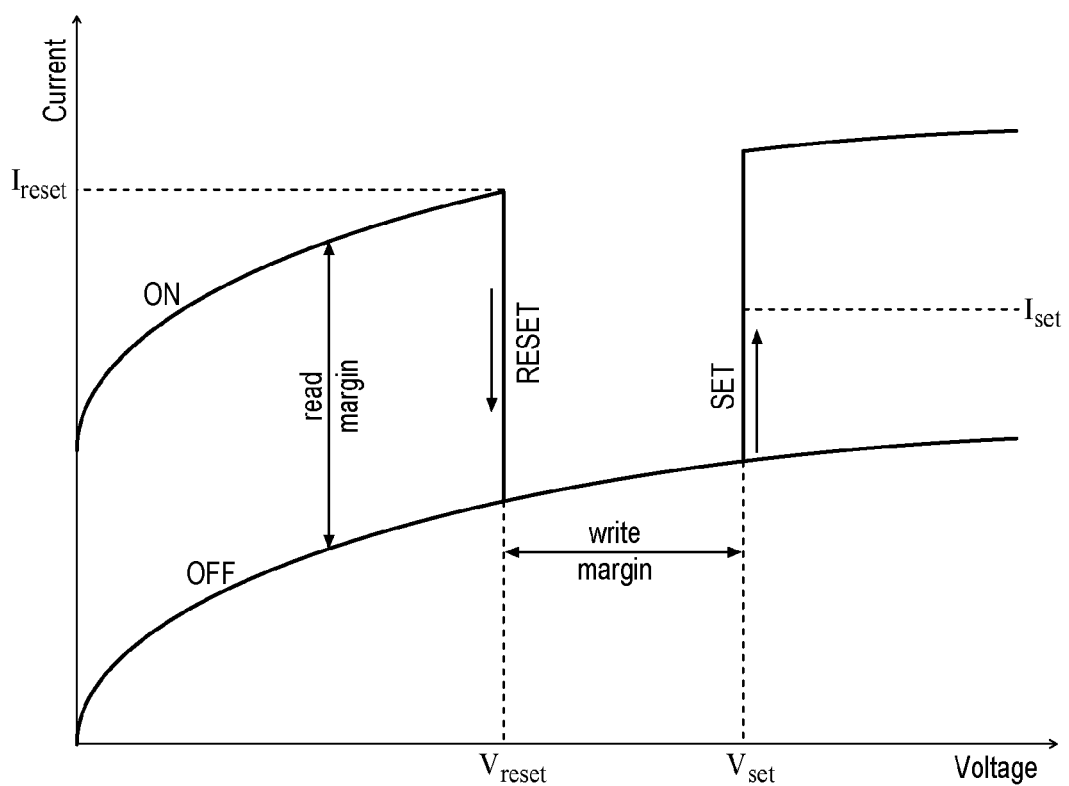
FIG. 15 shows an idealized current versus voltage curve for a resistive switching film with unipolar switching, illustrating the ON, OFF, RESET, and SET modes.

FIG. 15 shows an idealized current versus voltage curve for a resistive switching film with unipolar switching to better illustrate the ON, OFF, RESET, and SET modes. The material is crystallized in the ON state and the current rises along the ON curve as voltage is increased up V$_{reset}$. The current then drops to the OFF curve and increases gradually along the OFF curve until V$_{set}$ is reached, at which point it increases toward the ON curve. However, in devices, the current is limited to the dotted line, I$_{set}$, to prevent overcurrent. The read and write margins are shown in the figure. As shown by FIGS. 6 and 7, the NiO(L$_x$) films according to the invention follow these idealized curves better than any prior art material.

Figure 16:
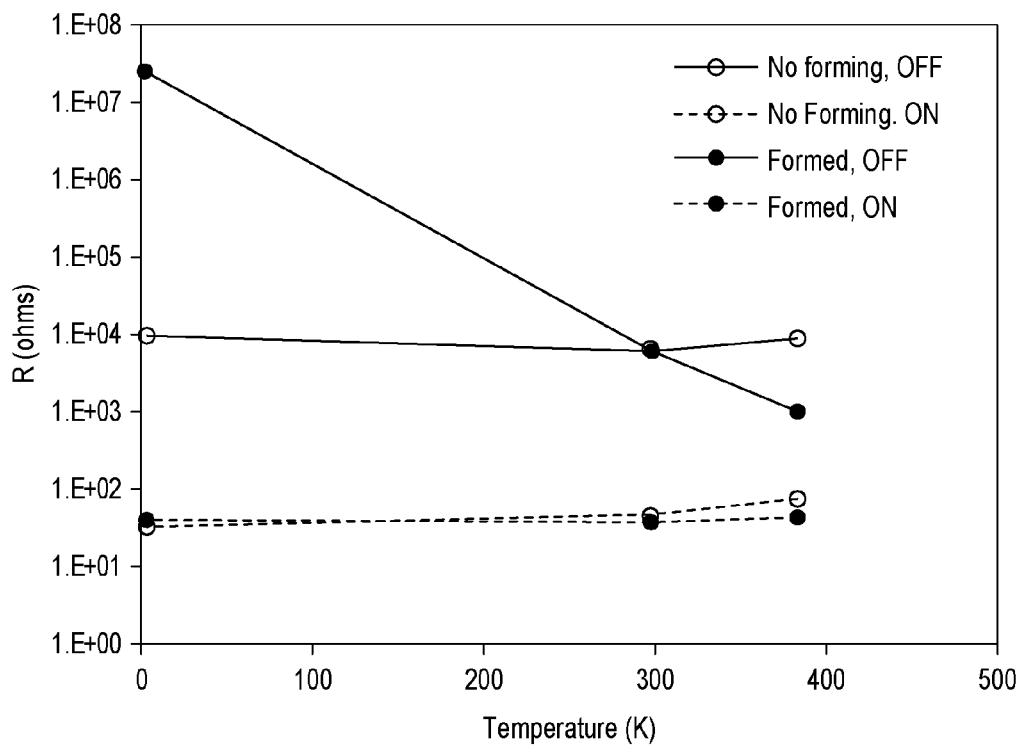
FIG. 16 shows a graph of Kelvin temperature versus resistance in Ohms for the ON and OFF states for a CEM thin film according to the invention and for a prior art thin film that crystallizes in the OFF state and requires forming before exhibiting variable resistance.

FIG. 16 shows a graph of Kelvin temperature versus resistance in Ohms for the ON and OFF states for a variable resistance thin film according to the invention and for a prior art thin film that crystallizes in the OFF state and requires forming before exhibiting variable resistance. As shown in the graph, for the material of the invention, NiO(C$_x$) in this case, the ON and OFF states vary only a little with temperature over the entire 400° K temperature range. Both curves rise a little at the higher temperatures. The rise is essentially uniform for both the ON and OFF state, so the resistance window remains essentially the same. Clearly, a memory made with the material according to the invention will be stable over any temperature range that memories should be stable over. However, for the prior art NiO film, without the extrinsic ligand, the OFF state changes linearly with temperature, while the conducting state is essentially flat. The resistance window changes by more than 500%. Just over the reasonable range that a memory must work, from about 250° K to about 350° K, the memory window changes by about over 100%. This prior art material clearly could not be used in a memory.

Figure 17:
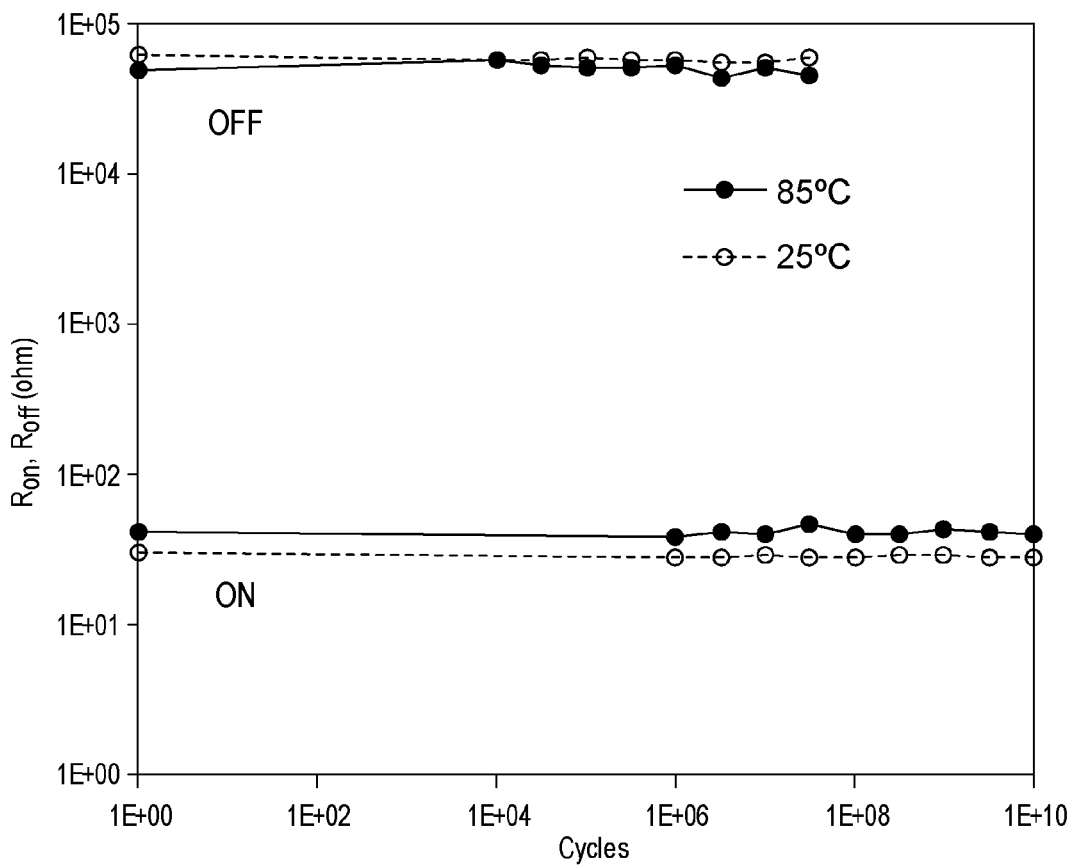
FIG. 17 is a graph of number of reading cycles versus resistance in Ohms for the ON and OFF states for a CEM thin film according to the invention, demonstrating that there is little or no fatigue.

FIG. 17 is a graph of number of reading cycles versus resistance in Ohms for the ON and OFF states for a resistive switching thin film according to the invention. Measurements were made at both 25° C. and 85° C. Reading fatigue measures the resistance in Ohms versus number of read cycles, where a read cycle comprises the application of a read voltage of one volt across the resistance element for a sufficient time to come to equilibrium with a reference voltage, followed by the removal of the voltage for a sufficient time to come to equilibrium at zero voltage. The measurements of reading fatigue were made for both the ON state and the OFF state at 85° C. and 25° C. The ON state was measured out to $10^{10}$ cycles and the OFF state was measured only to $10^8$ cycles because of time constraints. Both curves were flat, i.e., showing essentially no change in the measured resistance values, for the 25° C. measurement, and showing a minor variation of about two percent for the 85° C. measurement. This graph demonstrates there is little or no fatigue for the CEM material. Thus, a memory made of CEM material will be stable over any conceivable number of read cycles. Write fatigue has not yet been measured due to time constraints, though every indication is that it also will be essentially nil.

FIGS. 18 and 19 illustrate an exemplary non-volatile memory according to the invention. In this context, the word "substrate" can mean the underlying semiconductor material, such as 82 (FIG. 5) or 444 (FIG. 18), on which the integrated circuit is formed, as well as any object, such as layer 88 in FIG. 5, on which a thin film layer, such as 90, is deposited. In this disclosure, "substrate" shall generally mean the object to which the layer of interest is applied. For example, when we are talking about a thin film 90 of FIG. 5, the substrate on which it is initially deposited may include various elements, in particular, bottom electrode 88.

The long horizontal dimensions of substrates 82, 444 define planes that are considered to be a "horizontal" plane herein, and directions perpendicular to this plane are considered to be "vertical". The terms "lateral" or "laterally" refer to the direction of the flat plane of the semiconductor substrate, that is, parallel to the horizontal direction. Terms of orientation herein, such as "above", "top", "upper", "below", "bottom", and "lower" mean relative to substrate 82, 444. That is, if a second element is "above" a first element, it means it is farther from semiconductor substrate 82, 444; and if it is "below" another element, then it is closer to semiconductor substrate 82, 444 than the other element. Terms such as "above", "below", or "on" do not, by themselves, signify direct contact. However, terms such as "directly on" or "onto" do signify direct contact of one layer with an underlying layer. However, "directly above" does not require direct contact, but rather means that a second element that is "directly above" a first element means that if a line is drawn perpendicular to the underlying substrate and the line passes through the first element, it also will pass through the second element. It is understood that thin films of CEM fabricated in accordance with the invention have various shapes and conform to various topographies and features of an integrated circuit substrate. Accordingly, thin films of CEM in accordance with the invention are formed on planar substrates, in trenches and vias, on vertical sidewalls, and in other various non-horizontal and three-dimensional shapes.

The term "thin film" is used herein as it is used in the integrated circuit art. Generally, it means a film of less than a micron in thickness. The thin films disclosed herein are typically less than 500 nanometers (nm) in thickness. A thin film of correlated electron material fabricated by a method in accordance with the invention typically has a final thickness in a range of about from 20 nm to 300 nm, preferably in a range of about from 25 nm to 150 nm. The thin films having a thickness of about 60 nm or less are specifically designated "ultra-thin films" in this specification.

FIG. 18 is a cross-sectional view of a 1 transistor/1 resistor resistive switching cell 440 according to the invention. Cell 440 is formed on semiconductor wafer 444, which is preferably p-type silicon, but may be any other semiconductor. N-type active areas 452 and 453 are formed in wafer 444, and gate insulator 456 and gate 458 are formed over channel region 455 between the active areas as in conventional CMOS structures. A resistive switching device 446 is formed on one active area 453 and a metallization contact layer 466 is formed on the other active area. Resistive switching device 466 comprises bottom electrode 460, ligand-doped transition metal compound layer 462, and top electrode 464. While this structure is similar to 1T/1C DRAM memory structures, ligand-doped transition metal compound layer 462 does not store charge but rather switches resistance states. The resistance state can be identified by the voltage drop across the resistive switching device 446.

FIG. 19 is a block diagram of a memory circuit 900 including an exemplary resistive switching memory array 902 according to the principles of the present invention connected to write and read circuitry. The memory cells in memory array 902 may be any of the memory cells described above. In one embodiment, memory array 902 is formed of 128×128 memory cells. However, memory array 902 may have virtually any size as understood in the art. Resistive switching memory array 902 may be connected to a 7-bit decoder word line drive circuit 904 via word lines 906. Memory array 902 may be further coupled to a 3-to-1 bit multiplexor 908 and sense amplifiers/input-output transistors 910 via bit lines 912. Control logic circuitry 914 may be in communication with (i) the decoder 904 via control lines 916, (ii) multiplexer 908 via control lines 918, and (iii) sense amplifier 910 via control lines 920. External input lines may include an address input line 922 and control lines 924. A data output line 926 may be used to output data from memory circuit 900 via sense amplifiers/transceivers 910.

In operation, an external processor may be used to drive the control logic 914. Control logic circuitry 914 communicates with decoder 904, multiplexer 908, and sense amplifiers 910, which, in combination, are used to write data into resistive switching memory array 902 and read data stored in memory array 902. Control logic 914 and decoder 904 comprise a write circuit 928 for placing the resistive switching memory cell in a first resistive state or a second resistive state depending on information input into the memory; and control logic 914, multiplexer 908, and sense amps 910 comprise a read circuit 929 for sensing the state of the memory cell and providing an electrical signal corresponding to the sensed state of the memory cell. As is known in the art, the first resistance state may correspond to a logic "0" state, and the second resistance state may correspond to a logic "1" state, or vice versa. Herein, for convenience, we have referred to the first resistance state as the ON or low resistance state and the second resistance state as the OFF or high resistance state.

The resistance switching material is particularly suited for memories, preferably non-volatile memories. A wide variety of such memories are possible, some of which have been discussed above. It is also understood that the completed integrated circuit, such as 900, includes the switching material, such as 462 in an active element in the memory. Here, "active element" means an element that changes its electronic state during the operation of the memory.

Since a resistive switching retains the resistance state it is placed in indefinitely with no voltage or electric field applied to it, the resistive switching devices described herein are inherently non-volatile switching devices. As is known in the art, non-volatile switching devices can be used as or in non-volatile memories. Thus, the device 440 described above also comprises a non-volatile memory cell. Thus, it should be understood that whether the device has been referred to as a switch, a switching cell, a memory cell, or a memory in the above discussion, it has been determined by the context, and in all cases the other terms apply also.

A CEM memory cell is written to by applying either a SET or RESET voltage between the top electrode 92, 464 and the bottom electrode 88, 460. The CEM switching cell 440 of FIG. 18 can be read similarly to a ferroelectric or DRAM memory, using the select transistor 454 to select the cell to be read or written. A voltage or current is placed across the cells, and the resistance state of the CEM determines the voltage or charge developed across the cell, and by sense amplifiers 910. It is evident that, if the CEM is conductive, the voltage drop across the CEM will be much smaller than the voltage drop when the CEM is insulating. It is evident that this read can be described in terms of reading a resistance, a voltage, or a current. That is, referring to FIG. 4, if a read voltage of, say, about 0.3 volts, is placed across the cell, there will be a large resistance, voltage, or current difference between a cell that is in the state represented by curve 47 and a cell that is in the state represented by the curve 44. In any description, it is evident that the read is inherently non-destructive because the read voltage is well below $V_{RESET}$ and $V_{SET}$.

It is a feature of the invention that the effect of oxygen vacancies is canceled in the resistive switching materials according to the invention. The fact that the materials are in the low resistance state, or ON state, as deposited demonstrates this vacancy passivation effect. The vacancy charge sphere is the region about an ion or electron in which vacancies can affect the ion or electron. As shown by FIG. 1, in the prior art material without the extrinsic ligand, vacancies within this vacancy charge sphere trap electrons which are subsequently thermally detrapped. This destabilizes the high resistance state. This is the principle reason for the instability of prior art variable resistance materials. In the materials according to the invention, the effect of the oxygen vacancies is canceled by the ligand structure of the materials according to the invention. As shown by FIGS. 13, 14, and 16, the resistance states of the materials according to the invention are thermally stable. This further demonstrates vacancy passivation.

The particular systems, memory designs, and methods described herein are intended to illustrate the functionality and versatility of the invention, but the invention should not be construed to be limited to those particular embodiments. It is evident that those skilled in the art may make numerous uses and modifications of the specific embodiments described, or equivalent structures and processes may be substituted for the structures and processed described. For example, the memory cells may be arranged in columns or rows. Thus, herein, the array arrangement is referred to as a row/column arrangement. Further, while in some instances the preferred type of semiconductor wafer has been specified, it should be understood that in any of the devices described any semiconductor can be used. Further, in many instances, the specific type of semiconductor has been specified, e.g., n-type, p-type, n+, p+, etc.; however, those skilled in the art will recognize that other types may be used. For example, most devices work essentially the same if n-type is replaced with p-type and p-type is replaced with n-type. As another example, though platinum electrodes have been given as examples, those skilled in the art will recognize that such electrodes preferably are formed with a thin adhesive layer of titanium, and that the entire literature of oxide structures on platinum/titanium electrodes and the top electrode literature involving platinum, titanium, tungsten, and other materials can be applied. Any place a semiconductor is mentioned, those skilled in the art will recognize that gallium arsenide, germanium, germanium/silicon, and other semiconductor technologies can be substituted. As mentioned above, the term "metal" or "M" is used herein to indicate any suitable conductor, including metals such as platinum and tungsten, or polysilicon, or other conventional conductors known in the art. Since certain changes may be made in the above systems and methods without departing from the scope of the invention, it is intended that all subject matter contained in the above description or shown in the accompanying drawings may be interpreted as illustrative and not in a limiting sense; consequently, the invention is to be construed as embracing each and every novel feature and novel combination of features present or inherently possessed by the systems, devices, and methods described in the claims below and their equivalents.

What is claimed as new and desired to be protected by Letters Patent of the United States is:

1. A resistive switching integrated circuit memory comprising:
    a resistive switching memory cell including a resistive switching material comprising a transition metal compound containing an extrinsic ligand, wherein said extrinsic ligand comprises carbon, a carbon compound, or ammonia;
    a write circuit for placing said resistive switching memory cell in a first resistive state or a second resistive state depending on information input into said memory, wherein the resistance of said resistance switching material is higher in said second resistance state than in said first resistance state; and
    a read circuit for sensing the state of said memory cell and providing an electrical signal corresponding to the sensed state of said memory cell.

2. A resistive switching memory as in claim 1 wherein said transition metal compound is a transition metal oxide.

3. A resistive switching memory as in claim 1 wherein said resistive switching material is capable of being read $10^8$ times with less than 50% fatigue.

4. A resistive switching memory as in claim 1 wherein said resistive switching material is capable of being read $10^8$ times with less than 30% fatigue.

5. A resistive switching memory as in claim 1 wherein said resistive switching material is capable of being read $10^8$ times with less than 20% fatigue.

6. A resistive switching memory as in claim 1 wherein said resistive switching material has a memory window that changes less than 50% over a temperature range of from minus 50° C. to 75° C.

7. A resistive switching memory as in claim 1 wherein said resistive switching material has a memory window that changes less than 35% over a temperature range of from minus 50C. to 75° C.

8. A resistive switching memory as in claim 1 wherein said resistive switching material has a memory window that changes less than 25% over a temperature range of from minus 50°C. to 75° C.

9. A resistive switching memory as in claim 1 wherein said resistive switching material comprises a material selected from the group consisting of aluminum, cadmium, chromium, cobalt, copper, gold, iron, manganese, mercury, molybdenum, nickel, palladium, rhenium, ruthenium, silver, tin, titanium, vanadium, zinc, and a combination of these materials.

10. A resistive switching memory as in claim 1 wherein said extrinsic ligand further comprises one or more elements selected from the group consisting of oxygen, hydrogen, fluorine, nitrogen, chlorine, bromine, sulphur, and iodine.

11. A resistive switching integrated circuit memory comprising:
    a resistive switching memory cell including a resistive switching material comprising a transition metal and carbon;
    a write circuit for placing said resistive switching memory cell in a first resistive state or a second resistive state depending on information input into said memory, wherein the resistance of said resistance switching material is higher in said second resistance state than in said first resistance state; and
    a read circuit for sensing the state of said memory cell and providing an electrical signal corresponding to the sensed state of said memory cell.

12. A resistive switching memory as in claim 11 wherein said resistive switching material comprises a transition metal compound containing carbon.

* * * * *